United States Patent [19]

Merklinger et al.

[11] 4,155,038

[45] May 15, 1979

[54] AUTOMATIC COMPARISON CALIBRATION DEVICE WITH RATIO DETERMINATION

[75] Inventors: Harold M. Merklinger; Robert C. Trider, both of Dartmouth, Canada

[73] Assignee: Her Majesty the Queen in right of Canada, Canada

[21] Appl. No.: 850,354

[22] Filed: Nov. 10, 1977

[30] Foreign Application Priority Data

Oct. 13, 1977 [CA] Canada ................................. 288613

[51] Int. Cl.² .................. G01R 19/10; G06G 7/16
[52] U.S. Cl. ........................... 324/140 D; 328/161; 364/850
[58] Field of Search ............... 324/140 R, 140 D; 328/160, 161; 364/571, 606, 841, 850, 703

[56] References Cited

U.S. PATENT DOCUMENTS

| | | | |
|---|---|---|---|
| 3,100,097 | 8/1963 | Woltersdorf | 364/850 X |
| 3,652,930 | 3/1972 | Sugiyama et al. | 328/161 X |
| 3,652,945 | 3/1972 | Nakane et al. | 328/160 X |
| 3,789,663 | 2/1974 | Gold | 364/841 X |
| 3,795,918 | 3/1974 | Sunderland | 324/140 D X |

Primary Examiner—Gerard R. Strecker
Attorney, Agent, or Firm—Stevens, Davis, Miller & Mosher

[57] ABSTRACT

Apparatus for comparing an unknown signal with a reference signal is adapted to determine their ratio and, where a variation exists, to compensate the unknown signal to achieve unity ratio. The apparatus includes circuit means connectable to the signals for obtaining sum and difference signals. Means responsive to the sum and difference signals produce a control signal representing the product of these signals and feedback means responsive to the control signal generate a time-averaged feedback signal that is a measure of the ratio of the mean squares of the unknown and reference signals. Control means are disposed in the path of the unknown signal and are responsive to the feedback signal for varying the amplitude of the unknown signal to equilibrate and stabilize the apparatus when the mean squares of the reference signal and the compensated unknown signal are equal. A method for determining the ratio is disclosed together with embodiments of the apparatus which include an analog signal type as well as an analog-digital hybrid form.

11 Claims, 4 Drawing Figures

AUTOMATIC COMPARISON CALIBRATION DEVICE WITH RATIO DETERMINATION

This invention relates to a signal comparison method and apparatus and more particularly to such method and apparatus having utility in calibrating signal generating transducers.

Transducers that are well known in the art, such as microphones, are used widely in dry environment applications. Hydrophones, which may be looked upon as a wet environment analog of the microphone, enjoy a similar popularity in marine applications. Considering the hydrophone as a prime example, it will be appreciated that the device has seen and continues to see considerable activity in underwater sonic applications, particularly in sound navigation and ranging, referred to as SONAR.

Marine sonic applications vary widely from simple systems, where only a single hydrophone may be employed, to highly directional sonar systems in which multi-element hydrophone arrays are used. In such systems, it is frequently essential that hydrophone signals be accurately normalized prior to processing. This is particularly true if superdirective processing is to be used, or if predetermined null steering is to be effected.

In the more complex systems of the prior art, a common problem experienced is maintaining the calibration of hydrophones. The requirement for calibration is acute where arrays of hydrophones are used, and especially where several arrays are employed in a system. A frequent occurrence is to have one or more hydrophones in an array undergo a change in calibration for no apparent reason. Where considerable time is expended and extensive use of expensive equipment is employed to obtain readings, a substantial waste or resources will occur merely as a result of one or more hydrophones going off calibration. Thus, the success or failure of results obtained from a multi-element hydrophone array often depends on the sensitivity of each hydrophone element in the array which can change readily due to varying environmental conditions.

Methods are known in the art for overcoming the problem of changing hydrophone sensitivities. In each of these methods, it is required that all hydrophones in the array first be calibrated to determine their exact sensitivities. Once the sensitivities are accurately determined, individual ones of the hydrophones may be padded with capacitors to adjust sensitivities to a predetermined value. Another known method is to correct for varying sensitivities directly in a system by varying the gains of predetermined hydrophone signal channels. In this regard, computers may be used to good advantage to facilitate correction of test results for different hydrophone sensitivities.

Of considerable importance also is the ability of a hydrophone system to salvage data that would otherwise be useless and discarded. It has often occurred that long and exhaustive testing with hydrophone arrays has resulted in worthless data when the sensitivities of several hydrophones inexplicably go awry. It is noticeably apparent in this situation that there is a need for apparatus and methods which are capable of conducting normalization procedures in the aforenoted hydrophone arrays in an automatic and calibrated fashion, and with considerable accuracy.

A principal object of the invention therefore is to provide apparatus and a method which will balance or calibrate quickly and accurately a hydrophone having lesser or greater sensitivity than that of a reference hydrophone.

A provision of the invention therefore is apparatus which will precisely and automatically compare the amplitudes of two signals which, in terms of marine applications, results in a precise and automatic comparison of the sensitivities of two hydrophones.

Another provision of the invention is a method by which the sensitivities of the two hydrophones may be precisely and automatically compared, the method being based on the property that the difference of two signals having equal average power is uncorrelated with the sum of the two signals.

Yet another provision of the invention are circuit means provided for two hydrophones placed in the same noise environment which adjust the gain in one of the signal paths so that a required null correlation is achieved and maintained.

Still another provision of the invention is the realization of apparatus and a method that is particularly applicable to superdirective arrays of hydrophones to achieve precise relative element weights notwithstanding unknown or changing hydrophone sensitivities.

A further provision of the invention is apparatus and a method for calibrating hydrophones by determining the ratio of sensitivity of an unknown hydrophone relative to a known hydrophone and thereby determining the sensitivity of the unknown hydrophone in terms of the reference unit.

The invention also provides a hydrophone calibration apparatus that is constructed in the form of an analog circuit.

Still another provision of the invention is apparatus for calibrating hydrophones that is constructed in the form of a hybrid device using both analog and digital circuits.

The problems associated with the prior art may be substantially overcome and the foregoing provisions and object achieved by recourse to one aspect of the invention which is apparatus for determining the ratio of first and second signals. The apparatus comprises circuit means connectable to the signals for obtaining a sum and a difference thereof. Means responsive to the sum and difference signals are provided for producing a control signal representing the product thereof and corresponding to the difference of the squares of the first and second signals. The apparatus further comprises feedback means responsive to the control signal for generating a time-averaged feedback signal that is substantially a measure of the ratio of the mean squares of the first and second signals.

A second aspect of the invention relates to a method for determining the ratio of first and second signals. According to the method of the invention, the first and second signals are processed to provide a sum and difference thereof. The sum and difference signals are then combined to produce a control signal representing the product thereof and corresponding to the difference of the squares of the first and second signals. As a final step, the control signal is time-averaged to form a feedback signal that is substantially a measure of the ratio of the mean squares of the first and second signals.

The invention will now be more particularly described with reference to embodiments thereof shown, by way of example, in the accompanying drawings in which.

Figure 1:
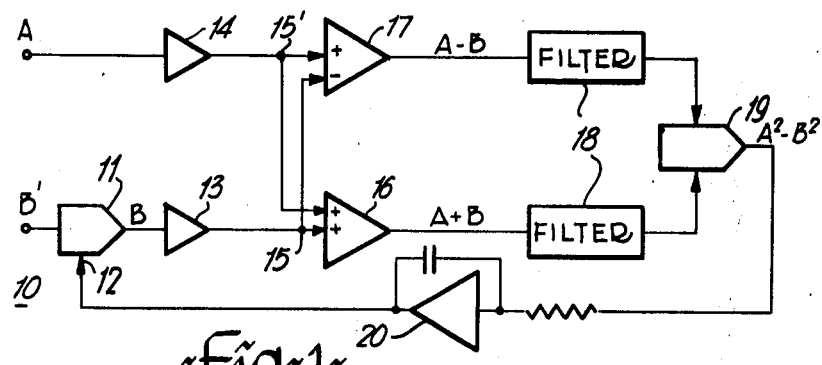
FIG. 1 is a block diagram of an analog embodiment of the invention.

Referring now to the drawings, FIG. 1 illustrates a block diagram of an analog embodiment of apparatus for determining the ratio of first and second signals, shown generally as an automatic ratio meter (ARM) 10. First and second input signals are designated B' and A, respectively. It will be observed that the signal B' is coupled to a signal input of signal control means shown specifically as a variable gain amplifier 11 having a control input 12 and an output coupled to an operational amplifier 13.

It will be understood that the first signal B' is an unknown variable. The second input signal A has known characteristics and is used as a reference against which the first input signal is compared. The signal A is thus applied directly to an input of an operational amplifier 14 having fixed gain. Since the signal B' is variable, the amplifier 11 has a compensating variable gain, both positive and negative, which is required for successful operation of the ARM 10. This feature of the invention will become more clearly understood in the detailed description to follow.

Each amplifier 13 and 14 has an output that is connected to the first inputs 15 and 15' of summing and difference amplifiers 16 and 17 respectively. A second input of each amplifier is shown cross-connected to the output of the operational amplifier in the other signal path or channel. A sum signal A+B is produced by the amplifier 16 and correspondingly a difference signal A−B is produced by the amplifier 17. Both signals are applied to respective inputs of filters 18 and are output therefrom to corresponding inputs of an amplifier or multiplier 19 having fixed gain. The multiplier 19 is responsive to the sum and difference signals and produces a control signal $A^2 - B^2$ at its output that represents the product of the sum and difference signals. The control signal is then applied to the input of feedback means in the ARM 10 that include an integrating amplifier 20 which time-averages the control signal. A time-averaged feedback control signal, which is a measure of the ratio of the mean squares of the unknown and reference signals, is then taken from the output of the amplifier 20 to the control input 12 of the amplifier 11 to vary the amplitude of the signal B' in a predetermined manner to derive the signal B. This portion of the ARM 10 will be later described in more complete detail.

The ARM 10 is an embodiment of the present invention having utility in working directly with input signals of the analog type. The operation of the arm 10 is based on a mathematical identity, $$A^2 - B^2 = (A-B)(A+B)$$

In terms of the input signals A and B', it will be understood that the signals will possess equal average powers provided that the sum and the difference of the two signals are uncorrelated.

Considering for the moment the first input signal B', it will be noted that at the input of the amplifier 11 the signal is in an unnormalized form. The amplifier 11 is disposed serially in the path of the signal B' and produces at its output a normalized signal B which is applied to a first input 15 of the amplifier 16. A second input of the amplifier 17 is connected to the input 15 and consequently receives the same signal.

Filtering is performed by a pair of filters 18 which are used in the A−B and A+B signal paths as shown. The filters are employed to select the frequency band in which the device operates. Phase matching of these filters is important. Although filters having identical amplitude responses could be used directly at the inputs of signals A and B', the location of the filters 18 as shown in FIG. 1 has the advantage that the normalization is applied to the unfiltered signals B' even though a frequency band having the highest signal-to-noise ratio has been selected to control the operation of the circuit.

Outputs of the filters 18 are applied to respective inputs of the multiplier 19, the output of which is $A^2 - B^2$ the product of the sum and difference signals. This signal is coupled to the input of the amplifier 20 of the feedback circuit where it is time-averaged to produce a feedback control signal that is applied to the input 12 of the gain control amplifier 11. If $A^2 - B^2$ is not equal to zero on average, the output of the amplifier 20 will slew in a direction necessary to minimize $A^2 - B^2$. In this way, the ARM 10 settles when the mean squares of the reference signal and the compensated unknown signal are equal, i.e., $\overline{A^2} = \overline{B^2}$, thereby balancing the signal B with the signal A. It will also be appreciated, moreover, that the output signal of the amplifier 20 is a measure of the ratio of the mean squares of the reference and unknown signals, $\overline{A^2}/\overline{B'^2}$. Thus knowing the reference amplitude, the amplitude of the unknown may be calculated.

The circuit configuration of the ARM 10, together with its operation, has been described in a general application in which an unknown signal and a reference signal are compared. The ARM functions to determine the ratio of the unknown signal relative to the input signal and also has the capability of adjusting the amplitude of the unknown input signal to equal that of the reference signal. This is referred to herein as compensating or normalizing the unknown signal. As described, this condition occurs when the mean squares of the reference signal and the compensated unknown signal are equal, $\overline{A^2} = \overline{B^2}$, at which point the ARM 10 equilibrates in a stable condition. The normalized signal B may then be output to serve in other applications.

It will be understood that the ARM 10 is therefore particularly well adapted for calibrating transducers such as hydrophones which are used in multi-element arrays. The importance of hydrophone calibrations has been hereinbefore discussed, and it will be recalled that it is essential that hydrophone signals be accurately normalized prior to processing if the full potential of subsequent processing is to be realized. The ARM 10 provides a relatively simple circuit that is adapted to conduct necessary normalization of a hydrophone in an automatic and calibrated fashion while producing high accuracy results of the order of 0.01 dB.

Of considerable importance is the fact that the ARM 10 is capable of recovering data which would otherwise be useless as a result of a change in hydrophone sensitivity during the course of a test. Assuming that the hydrophones are in statistically similar noise fields, the ARM 10 is capable of quickly and accurately determining the errant hydrophones in the arrays. Detecting such hydrophones is performed simply by taking the output from any hydrophone, including the defective unit, as a reference signal and then selectively applying the outputs from each of the other hydrophones in the array to the other signal channel. Comparing the ratios of the signals by observing the time-averaged feedback control signal reveals the hydrophones that have gone off calibration.

In the event that the reference signal is selected from an errant hydrophone, determination of this fact is readily performed after it is found, following several test readings, that the time-averaged feedback control signal is constant, thus indicating a fixed ratio of the mean squares of the reference and unknown input signals. The fact that the ratio is not unity indicates in the first instance that the two input signals A and B' are dissimilar in amplitude. And, the fact that the ratios are constant indicates that the reference signal selected is off calibration.

The ARM 10 performs well but is subject to problems as a result of a sensitivity to drift and offset, characteristics common in analog circuits. An accuracy of about 1% is obtainable with occasional trimming of the circuit, but a more fundamental problem arises because the effective time constant or averaging time of the feedback circuit depends upon the signal level. This latter problem may be remedied by placing automatic gain controls in the A−B and A+B signal paths. Circuit additions of this type, however, increase the complexity of the ARM 10 and only further add to the number of potential offset problems.

Figure 2:
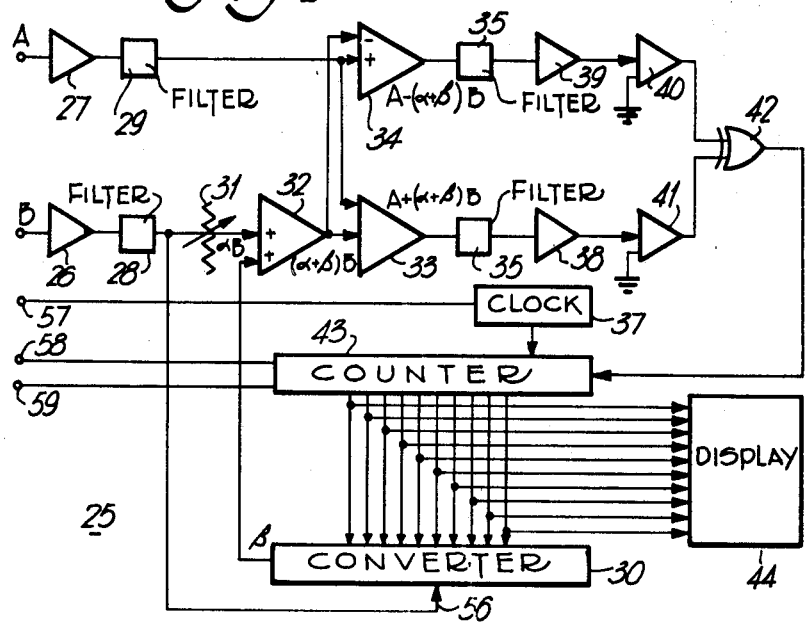
FIG. 2 is a block diagram of a hybrid embodiment of the invention.

FIG. 2 illustrates a block diagram of a hybrid analog-digital embodiment of the present invention, shown as an ARM 25, which avoids the drift and offset problems inherent in the circuit of FIG. 1.

Similarities and differences in the circuits of FIGS. 1 and 2 are readily apparent through observation. Signal paths for the first and second input signals, designated B and A respectively, differ in that buffer amplifiers 26 and 27 serve to isolate the ARM 25 from the external driving circuits (not shown). The amplifiers 25 and 27 are not strictly necessary, but if they are employed and if the ARM 25 is to be used in a signal calibration mode, the amplifiers must have gain and phase characteristics matched within the required accuracy of the apparatus as a whole.

The amplifiers 26 and 27 are followed by frequency selective filters 28 and 29. Like the buffer amplifiers, the filters 28 and 29 are not strictly necessary but if used must have characteristics which are closely matched in respect of amplitude response.

It will be noted that the B signal follows two separate signal paths after the filter 28. One path leads to an analog input 56 of a multiplying digital-to-analog converter 30. The other path leads through a variable attenuator 31 to an input of a summing amplifier 32. A second input of the amplifier 32 has coupled thereto the output of the converter 30. The amplifier 32 thus sums the outputs of the attenuator 31 and the converter 30. The output of the amplifier 32 is $(\alpha+\beta)B$ where $\alpha$ is the coefficient of the attenuator 31 and $\beta$ is the current attenuation coefficient of the converter 30. Setting the attenuator 31 determines the range of input ratios over which the ARM 25 will function correctly. The attenuator 31 may be deleted, but in this event the ARM 25 is limited to a single range.

Outputs of the amplifier 32 and the filter 29 are added and subtracted by summing and difference amplifiers 33 and 34 respectively. As in the case of the ARM 10, the accuracy of these operations is critical to the proper functioning of the ARM 25.

The outputs of the amplifiers 33 and 34 are $A+(\alpha+\beta)B$ and $A-(\alpha+\beta)B$, respectively. These signals are filtered by frequency selective filters 35 which must be low pass or band pass type filters. Similar to filters 38 and 29, the filters 35 are used to selectively pass desired signals. Since the frequency of a clock 37 used in a digital feedback circuit of the ARM 25 has a frequency $f_c$, the highest frequency passed by the filters 35 must be no greater than $f_c/2$. Furthermore, while the filters 35 need not have accurately matched amplitude response characteristics, matched phase response characteristics are required.

The filters 35 are followed by amplifiers 38 and 39 which are used to increase signal levels in the circuit to maintain accurate operation thereof. Although not shown in FIG. 2, automatic gain control may be applied to the amplifiers 38 and 39 so that the outputs thereof are approximately equal in level. Whereas the amplifiers 38 and 39 may be omitted, provided that the signal level at this point in the circuit is of sufficient amplitude, the amplifiers if used must have closely matched phase response characteristics like the filters 35.

Figure 4:
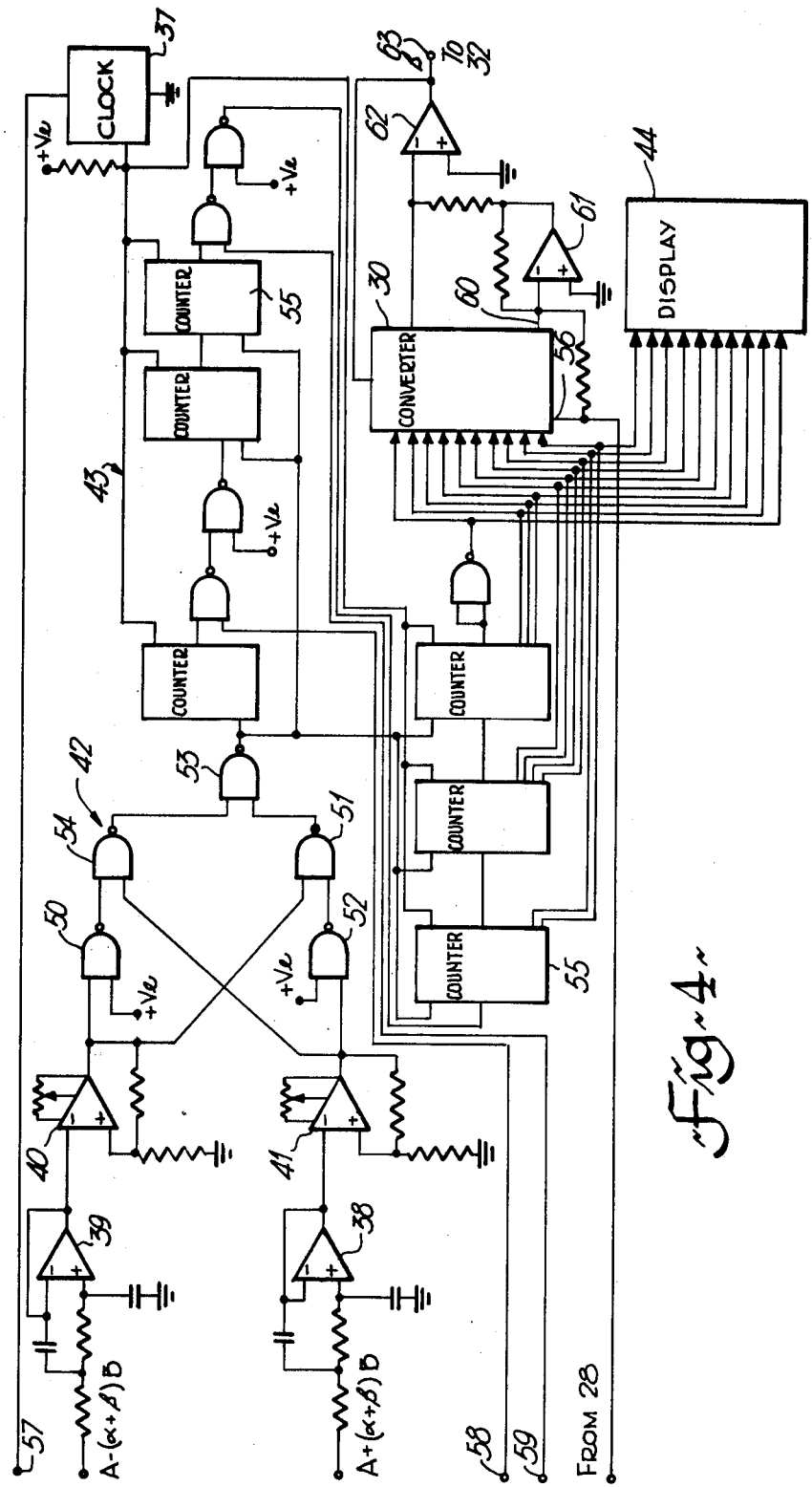
FIG. 4 is a schematic diagram of a portion of the circuit shown in FIG. 2.

Up to this point the circuit of the ARM 25 functions in the same manner as the ARM 10 of FIG. 1. The next stage of the ARM 25 differs substantially from the corresponding stage of the ARM 10 since the latter is adapted for use with analog signals whereas the ARM 25 has been configured in the form of a digital circuit to improve stability by avoiding offset and drift. FIG. 2 illustrates this portion of the ARM 25 in block diagram form. A detailed schematic diagram is illustrated in FIG. 4 and shows the amplifiers 38 and 39 with their analog outputs connected to corresponding inputs of the following digital circuit.

Although the circuits differ functionally, the results obtained from the digital portion of the ARM 25 are effectively the same as the analog counterpart in the ARM 10. Comparing the circuits in FIGS. 1 and 2 shows that the multiplier 19 of FIG. 1 has a counterpart in FIG. 2 which comprises two comparator amplifiers 40 and 41 that drive a two-input exclusive OR gate 42. The amplifiers 40 and 41 convert the analog signals to logical 1's and 0's in a manner to be later described in greater detail. If the analog input signal to a comparator amplifier is $\geq 0$, the output is a logical 1, referred to herein as a high, and if the input is $<0$, the output is a logical 0, referred to herein as a low. The comparator outputs are operated on by the gate 42 which produces a logical 1 if both inputs are either 1's or 0's and a logical 0 if the inputs differ. It will be understood that the signal at this point will be a 1 if $[A^2-(\alpha+\beta)^2B^2] \geq 0$ and a 0 if $[A^2-(\alpha+\beta)^2B^2] < 0$.

The amplifier 20 of the ARM 10 is replaced in the ARM 25 with an UP/DOWN BCD counter 43 having a plurality of outputs that are coupled to the converter 30 and which set the multiplying coefficient thereof. As in the case of the ARM 10, which has a stable condition when $\overline{A^2} = \overline{B^2}$, the ARM 25 reaches equilibrium and becomes stable when A−B is as often positive as negative.

A feature employed in the ARM 25 which is not shown in the ARM 10 is a display 44 which the output bit of the counter 43 are coupled. In this embodiment of the invention, the display 44 comprises a plurality of LEDS (not shown) which are operably responsive to the input bits and illuminate to show the bit pattern. In the embodiment shown in FIG. 4, the least significant bit corresponds to $2^{-9}$ and the most significant bit corresponds to $2^0$ or 1.

The operation of the ARM 25 is therefore visually determined by reference to the display 44. In the embodiment shown in FIG. 4, the LED pattern corresponds to a certain value of $\beta$, the coefficient by which the unbalanced signal B is multiplied by adding 1 to the value of $\beta$ from the LED display. When a balanced condition is reached, the ratio of the two signals can be obtained since at balance, $A=(1+\beta)B$. Thus $A/B=1+\beta$ and by taking 20log of each side of the equation, the ratio of the two input signals can be measured in decibels. The value of $\beta$ may be determined from the relation, $\beta=1-$DECIMAL DIGIT represented by BIT PATTERN In the description of FIG. 2, it was stated that the comparators 40 and 41 convert their analog signal inputs to logical 1's and 0's. Referring now to FIG. 4, it will be observed that the output from the amplifier 40 is coupled to a first input of a first pair of two-input NAND gates 50 and 51 that form part of the exclusive OR gate 42 shown in FIG. 2. The output from the amplifier 41 in like fashion is connected to a first input of a second pair of like NAND gates 52 and 54 in the gate 42. The output of the gate 50 is connected to a second input of the gate 54 and the output of the gate 52 is connected to a corresponding second input of the gate 51. The outputs of the gates 51 and 54 are coupled to the inputs of a two-input NAND gate 53. The second inputs of the gates 50 and 52 are each connected to a predetermined source of positive voltage as shown.

Since individuals to whom this specification appertains are knowledgeable in the operation of exclusive OR gates, a detailed description of the gate 42 is considered to be unnecessary and has therefore been omitted. It will suffice to understand that if the outputs from the amplifiers 40 and 41 are both high, then both inputs to the gate 53 are high resulting in a logical output 1. Similarly, if the outputs of the amplifiers 40 and 41 are low the inputs to the gate 53 are low which also results in a logical output 1.

The UP/DOWN counter 43 is shown in FIG. 4 to comprise a plurality of individual counting stages 55, each of which is controlled by the output of the gate 53 to count pulses obtained from the clock 37. The stages 55 thus count upwards if the UP/DOWN input is a logical 1 and downwards if the input is a logical 0. It is important in some counters to ensure that the counter UP/DOWN transitions do not coincide with the clock pulses otherwise the stages 55 will be left in an indeterminate state. Depending on the accuracy required, the counter 43 may comprise any number n of the stages 55 where $n \geq m$, and where m is the number of digital inputs leading to the converter 30. In the event that $n>m$, the m most significant (slowest changing) outputs of the counter 43 are fed to the converter 30 as shown. Additionally, the outputs are applied to the display 44 which provides an indication of the operation of the ARM 25.

In FIG. 2 the analog signal output from the filter 28 is directly connected to the input 56 of the converter 30. The analog signal is then multiplied by the converter 30 with a coefficient $\beta$ which is determined by the outputs from the counter 43. The circuit is arranged so that when the input to the counter 43 is a 1, $\beta$ will increase with time up to some predetermined limit. The coefficient $\beta$ may be held at this limit by subsidiary logic (not shown) connected to a logic input 57. On the other hand, the coefficient $\beta$ may be permitted to search, which is to say that from its greatest limit $\beta$ passes immediately to the lowest limit and increases through its entire range up to its maximum. If the input to the counter 43 is a 0, the coefficient $\beta$ moves in the reverse direction so that it gradually decreases to its lowest limit. Similarly, $\beta$ may be held there or it may be permitted to restart 'at the top' and search downwards again.

Additional logic lines 58 and 59 are provided to control the speed of operation of the ARM 25 by controlling the number of counting stages used in the counter 43. This is accomplished by connecting additional logic circuitry (not shown) to these lines or by switching the lines manually in accordance with the information presented in the following table.

| COUNTER SPEED | LOGIC LINE 57 | LOGIC LINE 58 | LOGIC LINE 59 |
|---|---|---|---|
| Fast | +5V | +5V, GND | GND |
| Slow | +5V | GND | +5V |
| Very Slow | +5V | +5V | +5V |
| Hold | GND | +5V, GND | +5V, GND |

An analog output 60 of the converter 30 is applied to an input of an amplifier 61. The output from the amplifier 61 is taken to an input of an amplifier 62 having an output 63 that is connected to a control input of the amplifier 32 for varying the amplitude of the first input signal B.

The converter 30 may be configured so that $\beta$ may have both positive and negative values, or just positive or just negative, depending upon the ultimate application. Consider now for example that $\overline{A^2} = \overline{B^2}$, that is the two inputs are of equal average power, and that initially $\alpha = 0.5$ and $\beta = 0$. In this example, $A^2 - (\alpha+\beta)^2 B^2$ will, on average, be positive. The counter 43 will count both upwards and downwards depending at any instant upon the instantaneous sign of $A^2 - (\alpha+\beta)^2 B^2$. But since $A^2 - (\alpha+\beta)^2 B^2$ is on average positive, the counter will spend more time counting upwards than downwards. Thus, $\beta$ will gradually increase. When $\beta$ reaches 0.5, $\alpha+\beta=1$ and $A^2-B^2$ becomes equally often positive and negative. Thus the system stabilizes at this point. Occasionally $\beta$ will become greater than 0.5 but when this happens the counter will count down more often than up and so $\beta$ is decreased.

A measure of averaging may be used to ensure that any changes happen slowly, by setting $n>m$. If $n>m$, $2^{(n-m)}$ counts net in either direction are required to cause any change in $\beta$. Thus the greater $(n-m)$, the greater is the effect of averaging time of the ARM 25. Since $\beta$ is set by the outputs of the counter 43, these outputs may be used to drive the display 44 shown in FIGS. 2 and 4 in order to read out the value of $\beta$. If $\alpha$ is also known, this information may be used to display $\alpha+\beta$. The circuitry for doing this is not known. Since, at equilibrium $\overline{A^2 - (\alpha+\beta)^2 B^2} = 0$, $\overline{A^2}/\overline{B^2} = (\alpha+\beta)^2$.

It has been described that the counter 43 sets the multiplying coefficient $\beta$ of the converter 30. The ARM 25 stabilizes when $A^2-B^2$ is as often positive as negative. The counter 43 in this case counts up and down without any net increase or decrease. The counter output is then a measure of the ratio $\overline{A^2}/\overline{B^2}$ in binary form. The effective averaging time is determined by the number of the stages 55 preceding those interfaced to the converter 30. In this embodiment, however, it will be understood that the effective averaging time does not depend upon signal level.

A minor difference between the ARM 25 and the ARM 10 is that the former circuit does not normalize the true mean squares of the signals. The MEDIAN rather than the MEAN of $A^2 - B^2$ is set to 0. This is of no consequence if A and B are similarly distributed in amplitude. If one of the signals were DC, it would be the root median square signal of the other with which the DC level would be compared.

Figure 3:
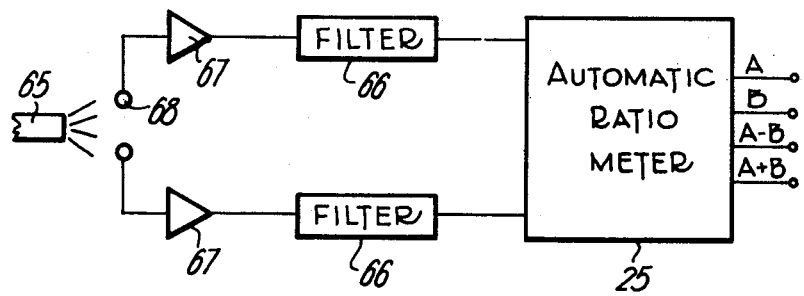
FIG. 3 is a block diagram of a test system for the embodiments illustrated in FIGS. 1 and 2.

A block diagram of a test system is shown in FIG. 3. The purpose of the system is to test the straightforward comparison calibration of hydrophones using an ambient noise background. Tests were conducted in a concrete tank measuring $10' \times 10' \times 20'$. This tank is normally considered useful for calibration down to a frequency of 2 kHz using standard pulse techniques. In the system illustrated, a moving coil source 65 was used to generate noise in the band 200 Hz—5 kHz. Filters 66 were connected serially with hydrophone preamplifiers 67 to restrict the effective measurement range to 2 kHz maximum. Various hydrophones 68 were disposed in pairs at a depth of about three feet and separation between the hydrophones was about one foot. The hydrophones 68 were mounted on a rotating station so that hydrophone positions could be interchanged by rotating the station 180°.

In the course of the test, the first step was to connect one hydrophone to both preamplifiers 67 and to adjust the gain of one preamplifier so that the ARM 25 indicated 1.000. With the hydrophones 68 reconnected to their respective amplifiers, a first measurement was obtained. The hydrophone positions were then interchanged and a second measurement obtained. The true ratio of sensitivities was taken to be the geometric mean of the two measurements noted. Repeated tests using different hydrophone pairs yielded results which were well within the limits of uncertainty on previous calibrated curves for the hydrophones. More significantly, repeated comparisons of the same pairs gave results consistent to 0.05 dB.

An advantage of the present invention in normal calibration procedures is that two signals are compared simultaneously. Fluctuations in source level or propagation conditions are therefore relatively unimportant.

A number of separate embodiments of the invention may be used to preset the levels of a number of hydrophone outputs to some fixed, predetermined level. Assume, for example, that during data recording a calibration tone was recorded at a known level on all channels of a record/reproduce apparatus. On replay, the level may be re-established by feeding a second calibration tone of the desired level into the reference signal input A of each ARM unit. Each ARM will the normalize its B input to that desired level. An ARM 25, for example, may then be placed in 'HOLD' by interrupting the clock 37 and the reproduction apparatus is correctly calibrated.

An application frequently carried out by the ARM 25 is in the recovery of bad data. During use of superdirective arrays, which are quite critical of hydrophone weighting, it occasionally happens that one or more signal channels have changed gain, or worse, fluctuated in gain for reasons unknown. The ARM 25 allows the level of the errant channel or channels to be re-established and achieves useful analysis of otherwise unusable data.

Having due regard to the afore-described embodiments of the invention and the resulting variations in structure, it will be apparent to those skilled in the art that the examples described and illustrated should not be considered as limiting but rather as exemplary embodiments of the invention which is defined in the appended claims.

The embodiments of the invention in which an exclusive property or privilege is claimed are defined as follows:

1. Apparatus for determining the ratio of first and second input signals, comprising:
   circuit means connectable to said input signals for obtaining a sum and a difference thereof;
   means responsive to the sum and difference signals for producing a control signal representing the product thereof and corresponding to the difference of the squares of said first and second input signals;
   feedback means responsive to the control signal for generating a time-averaged feedback signal from said first and second input signals that is substantially a measure of the ratio of the mean squares of the first and second input signals; and,
   control means responsive to said feedback signal for altering the amplitude of one of said first and second input signals.

2. Apparatus as claimed in claim 1 further comprising display means coupled to the feedback means and responsive to the feedback signal for indicating the ratio of the mean squares of the first and second input signals.

3. Apparatus as claimed in claim 2 wherein said circuit means comprises:
   a summing amplifier having a first input connectable to said first input signal representing a source of unknown signals; and
   a difference amplifier having a first input connectable to said second input signal representing a source of reference signals, each amplifier having a second input cross-connected to the first input of the other amplifier.

4. Apparatus as claimed in claim 3 wherein the control means comprises a variable gain amplifier serially connected with the first input of the summing amplifier and having an input connectable to the source of unknown signals.

5. Apparatus as claimed in claim 4 wherein the means responsive to the sum and difference signals comprises a fixed gain amplifier; and
   the feedback means comprises an integrating amplifier having an input coupled to the output of the fixed gain amplifier and an output connected to a control input of the variable gain amplifier.

6. Apparatus as claimed in claim 3 wherein the control means comprise a multiplying digital-to-analog converter serially connected with the first input of the summing amplifier and having an input connectable to the source of unknown signals.

7. Apparatus as claimed in claim 6 wherein the means responsive to the sum and difference signals comprise a comparator amplifier having inputs coupled to individual ones of outputs of the summing and difference amplifiers for converting the sum and difference signals into predetermined logical 1's and 0's.

8. Apparatus as claimed in claim 7 further comprising an exclusive OR gate having inputs coupled to corresponding outputs of the comparator amplifier and an output producing a logical 1 when the gate inputs are the same and a logical 0 when the gate inputs differ.

9. Apparatus as claimed in claim 8 wherein the feedback means comprise an UP/DOWN counter having a plurality of outputs coupled to corresponding ones of inputs of said converter to control the multiplying coefficient thereof and an input coupled to the output of said gate and selectively enabled by said logical 1's and 0's.

10. Apparatus as claimed in claim 9 further comprising a clock having a pulse output coupled to said counter, the counter being enabled by a logical 1 to count the clock pulses upward and by a logical 0 to count said pulses downward, the upward count increasing said coefficient and the downward count decreasing the coefficient whereby the apparatus reaches equilibrium and becomes stable when the difference of the squares of the normalized and second input signals is as often positive as negative.

11. A method for determining the ratio of first and second input signals, comprising the steps of:
generating a sum and difference of said first and second input signals;
combining the sum and difference signals to produce a control signal representing the product thereof and corresponding to the difference of the squares of said first and second input signals;
time-averaging the control signal to form a feedback signal from said first and second input signals that is substantially a measure of the ratio of the mean squares of the first and second input signals; and,
varying the amplitude of one of said first and second input signals in accordance with amplitude variations in said feedback signal.

* * * * *